United States Patent
Wang et al.

(10) Patent No.: US 10,168,622 B2
(45) Date of Patent: Jan. 1, 2019

(54) MQW DEVICES AND METHODS FOR SEMICONDUCTOR PATTERNING SYSTEMS

(71) Applicant: Samsung Electronics Co., Ltd., Suwon-si, Gyeonggi-do (KR)

(72) Inventors: Yibing M. Wang, Pasadena, CA (US); Duhyun Lee, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/628,611

(22) Filed: Jun. 20, 2017

(65) Prior Publication Data
US 2017/0285486 A1    Oct. 5, 2017

Related U.S. Application Data

(62) Division of application No. 14/714,245, filed on May 15, 2015, now Pat. No. 9,703,208.

(60) Provisional application No. 62/089,173, filed on Dec. 8, 2014.

(51) Int. Cl.
*G03F 7/20* (2006.01)
*G02F 1/017* (2006.01)
*G02F 1/01* (2006.01)

(52) U.S. Cl.
CPC .......... *G03F 7/70291* (2013.01); *G02F 1/017* (2013.01); *G02F 1/0121* (2013.01)

(58) Field of Classification Search
CPC .... G02F 1/0121; G02F 1/017; G02F 1/01716; G02F 2001/0155; G02F 2203/12; G03F 7/70058; G03F 7/70483; G03F 7/70291
See application file for complete search history.

(56) References Cited

U.S. PATENT DOCUMENTS

| | | | |
|---|---|---|---|
| 5,671,083 A | 9/1997 | Conner et al. | |
| 6,097,361 A * | 8/2000 | Rohner | G03F 7/70466 345/102 |
| 6,140,983 A | 10/2000 | Quanrud | |

(Continued)

OTHER PUBLICATIONS

Chan et al., "High-resolution maskless lithography," Society of Photo-Optical Instrumentation Engineers, J. Microlith., Microfab., Microsyst., vol. 2 No. 4, Oct. 2003, pp. 331-339.

*Primary Examiner* — Steven H Whitesell Gordon
(74) *Attorney, Agent, or Firm* — Renaissance IP Law Group LLP

(57) ABSTRACT

MQW devices, IC chips and methods may be used in semiconductor lithography patterning systems. An MQW device includes an array of pixels that have transmission elements and associated support circuits. The support circuits have preliminary memory cells and final memory cells. The final memory cells store transmittance values that control transmittances of the associated transmission elements. This way, exposure of a target with a lithography system for purposes of patterning the target may be performed through the transmission elements according to the controlled transmittances, while subsequent transmittance values are being received by the preliminary memory cells from memory banks. The exposure of the target therefore needs to pause for less time, in order to wait for the MQW device to be refreshed with the subsequent transmittance values. Accordingly the whole semiconductor lithography patterning system may operate faster and thus have more throughput.

20 Claims, 11 Drawing Sheets

MQW DEVICE IN SEMICONDUCTOR PATTERNING SYSTEM

(56) References Cited

U.S. PATENT DOCUMENTS

| | | |
|---|---|---|
| 6,724,378 B2 | 4/2004 | Tamura et al. |
| 7,129,925 B2 | 10/2006 | Schloeman et al. |
| 7,903,104 B2 | 3/2011 | Chen et al. |
| 2005/0213189 A1 | 9/2005 | Schroeder |
| 2006/0193233 A1 | 8/2006 | Fujimori et al. |

* cited by examiner

*MQW DEVICE IN SEMICONDUCTOR PATTERNING SYSTEM*

*MQW DEVICE IN SEMICONDUCTOR PATTERNING SYSTEM*

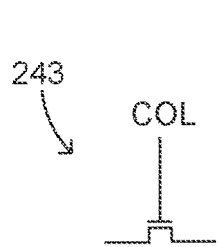
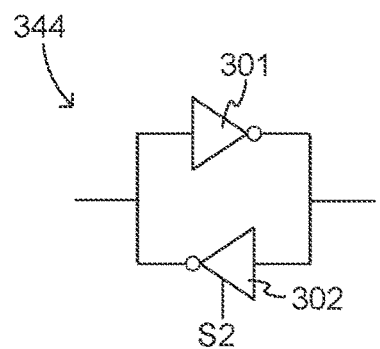
FIG. 2   FIG. 3
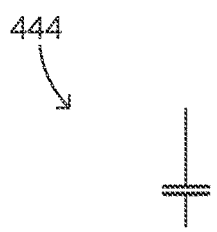
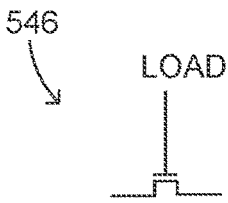
FIG. 4   FIG. 5
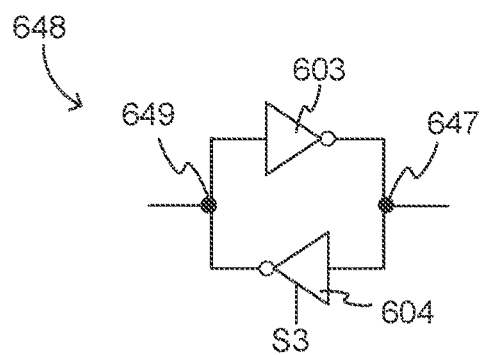
FIG. 6

FIG. 7A  *SUPPORT CIRCUIT*

FIG. 8A　　　*SUPPORT CIRCUIT*

*SUPPORT CIRCUIT*

MQW DEVICES AND METHODS FOR SEMICONDUCTOR PATTERNING SYSTEMS

CROSS REFERENCE TO RELATED PATENT APPLICATIONS

This application is divisional patent application of U.S. patent application Ser. No. 14/714,245, filed May 15, 2015, which claims priority from U.S. Provisional Patent Application Ser. No. 62/089,173, filed on Dec. 8, 2014, the disclosure of which is hereby incorporated by reference.

BRIEF SUMMARY

The present description gives instances of Multiple-Quantum-Well (MQW) devices, IC chips and methods that may be used in semiconductor lithography patterning systems, the use of which may help overcome problems and limitations of the prior art.

In embodiments, an MQW device includes an array of pixels that have transmission elements and associated support circuits. The support circuits have respective preliminary memory cells and final memory cells. The final memory cells store transmittance values that control transmittances of the associated transmission elements. This way, exposure of a target with a lithography system for purposes of patterning the target may be performed through the transmission elements according to the controlled transmittances, while subsequent transmittance values are being received by the preliminary memory cells from memory banks.

An advantage over the prior art arises from the fact that the exposure of the target needs to pause for less time, in order to wait for the MQW device to be refreshed with the subsequent transmittance values. Accordingly the whole semiconductor lithography patterning system may operate faster and thus have more throughput.

These and other features and advantages of this description will become more readily apparent from the Detailed Description, which proceeds with reference to the associated drawings in which:

BRIEF DESCRIPTION OF THE DRAWINGS

FIG. 2 is a diagram of a FET that can be used as a preliminary switch in the support circuit of FIG. 1C according to embodiments.

FIG. 3 is a schematic diagram of a preliminary memory cell in the support circuit of FIG. 1C according to embodiments.

FIG. 4 is a diagram of a capacitor that can be used as a preliminary memory cell in the support circuit of FIG. 1C according to embodiments.

FIG. 5 is a diagram of a FET that can be used as a load switch in the support circuit of FIG. 1C according to embodiments.

FIG. 6 is a schematic diagram of a final memory cell in the support circuit of FIG. 1C according to embodiments.

FIG. 7A is a schematic diagram of a sample embodiment of the support circuit of FIG. 1C.

FIG. 8A is a schematic diagram of another sample embodiment of the support circuit of FIG. 1C.

DETAILED DESCRIPTION

As has been mentioned, the present description is about components and methods that may be used in semiconductor patterning systems. Embodiments are now described in more detail.

Figure 1A:
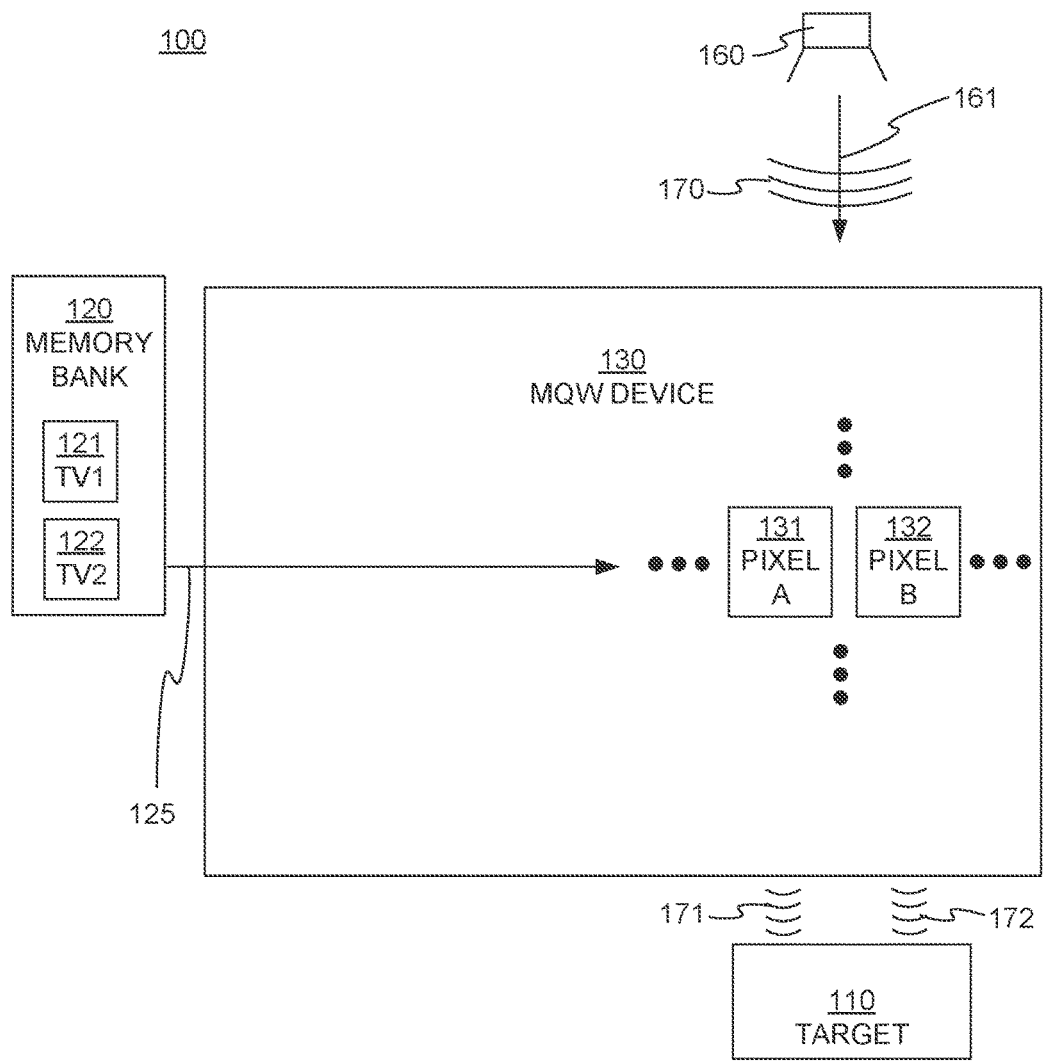
FIG. 1A is a diagram of a semiconductor patterning system using a sample MQW device made according to embodiments.

FIG. 1A is a diagram of a semiconductor patterning system 100, which is also known as a lithography system 100. System 100 is intended to pattern a target 110, so as to turn it into a useful device. Target 110 can be made of semiconductor materials. System 100 includes a source 160 that is configured to transmit a beam 170 of energy. The energy of beam 170 can be ions, optical energy, and so on, and may ultimately pattern target 110.

System 100 also includes a memory bank 120 and a data line 125 coupled to memory bank 120. Memory bank 120 is configured to store data that includes pre-calculated transmittance values, such as a first transmittance value TV1 121 and a second transmittance value TV2 122. These transmittance values will ultimately determine how target 110 is patterned.

System 100 further includes a Multiple-Quantum-Well (MQW) device 130 that is made according to embodiments, and is configured for use in system 100. MQW device 130 may include pixels that are made according to embodiments, and are arranged in a two-dimensional array of rows and columns. FIG. 1A shows only two pixels, namely pixel A 131 and pixel B 132. Pixels 131, 132 are in the same row. The pixels of MQW device 130 are actually optical elements that operate in transmission. These optical elements can be smart optical elements, whose transmission depends on the transmittance values stored in memory bank 120. For example, when a transmittance value that is stored in memory bank 120 has been brought from to pixel A 131, the optical element may permit transmission or not depending on whether the transmittance value is 0 or 1. The MQW device 130 can be a Self-Electro Optic Effect (SEED) device. Some MQW devices that are made from GaAs/AlGaAs can be designed for operation at 850 nm.

Source 160 is configured to transmit beam 170 towards MQW device 130, along a direction 161. Since beam 170 passes through the pixels that permit transmission, multiple beamlets of transmitted beam 170 emerge from MQW device 130, and reach and pattern target 110. In the example of FIG. 1A only two such beamlets 171, 172 are shown. Target 110 is patterned because some of its locations receive beamlets and others don't.

In system 100, the pre-calculated transmittance values are transferred from memory bank 120 via data line 125 at a high rate, and loaded to the pixels so as to control how much power they individually permit to be transmitted. Then beam 170 is transmitted while a frame of these transmittance values is loaded onto the pixels. In embodiments, target 110 is moveable within system 100, and in fact progresses through a series of positions so that multiple locations of its surface are patterned. Beamlets 171, 172 can be repeated when target 110 has moved to the next such position, with different transmittance values loaded in the pixels.

A challenge in the prior art is that a blackout period for beam 170 may need to be maintained after an exposure session of illuminating with beam 170, and while a new frame of transmittance values is being loaded from memory bank 120. The blackout period limits how fast target 110 may be moved through system 100, and therefore the overall speed and throughput of system 100.

Embodiments of pixels of MQW device 130, such as pixels 131, 132, can be structured such that they permit refreshing by loading transmittance values for a new frame in a manner that can reduce the blackout period. The blackout period may become even shorter than the time needed for target 110 to move to the next position, in which case the blackout period ceases to be a limitation to the throughput of system 100. In some embodiments, the blackout period may even be eliminated completely. Embodiments are now described in more detail.

Figure 1B:
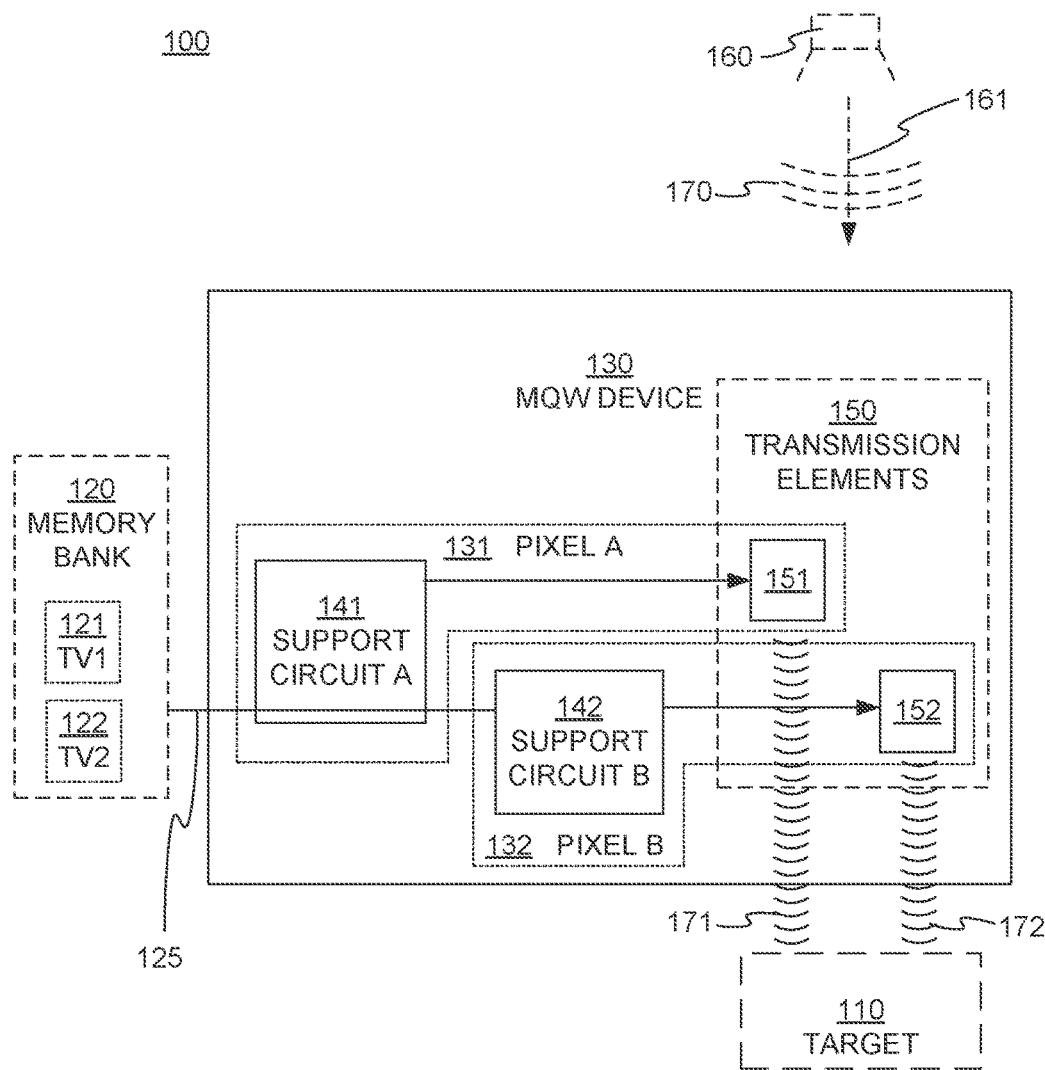
FIG. 1B largely repeats the diagram of FIG. 1A, and further shows salient details of the sample MQW device made according to embodiments.

FIG. 1B largely repeats the diagram of FIG. 1A. A difference is that pixels 131, 132 are shown in more detail, and with their components artificially rearranged to facilitate aspects of this description. More particularly, first pixel A 131 includes a first transmission element 151 and a first support circuit A 141. And second pixel B 132 includes a second transmission element 152 and a second support circuit B 142.

First support circuit 141 can be configured to receive first transmittance value TV1 121 via data line 125. As will be seen later, first support circuit 141 can also be configured to store the received first transmittance value TV1 121, and a transmittance of first transmission element 151 depends on first transmittance value TV1 121 that is stored in first support circuit A 141.

Second support circuit 142 can be configured to receive via data line 125 and store second transmittance value TV2 122. A transmittance of second transmission element 152 depends on second transmittance value TV2 122 that is stored in second support circuit B 142. In some embodiments, as will be seen later, second support circuit 142 receives second transmittance value TV2 122 via first support circuit 141, although this is not required.

Transmission elements 151, 152 are part of a group 150 of transmission elements. Group 150 can be generally in the path of beam 170 as it comes along direction 161. As seen above, their transmittances depend on the stored first and second transmittance values TV1 121, TV2 122. Accordingly, transmission elements 151, 152 permit to emerge through them, according to their transmittances, beamlets 171, 172 of transmitted beam 170 that reaches MQW device 130. Indeed, beamlets 171, 172 are shown emanating from transmission elements 151, 152 respectively, in better detail than in FIG. 1A.

In embodiments, the support circuits of the pixels of MQW device 130 use dual memory cells. A final memory cell is used to store the current value for a pixel, and a preliminary memory cell is used to store the next value. This may shorten or practically eliminate the blackout period. Embodiments are now described in more detail.

Figure 1C:
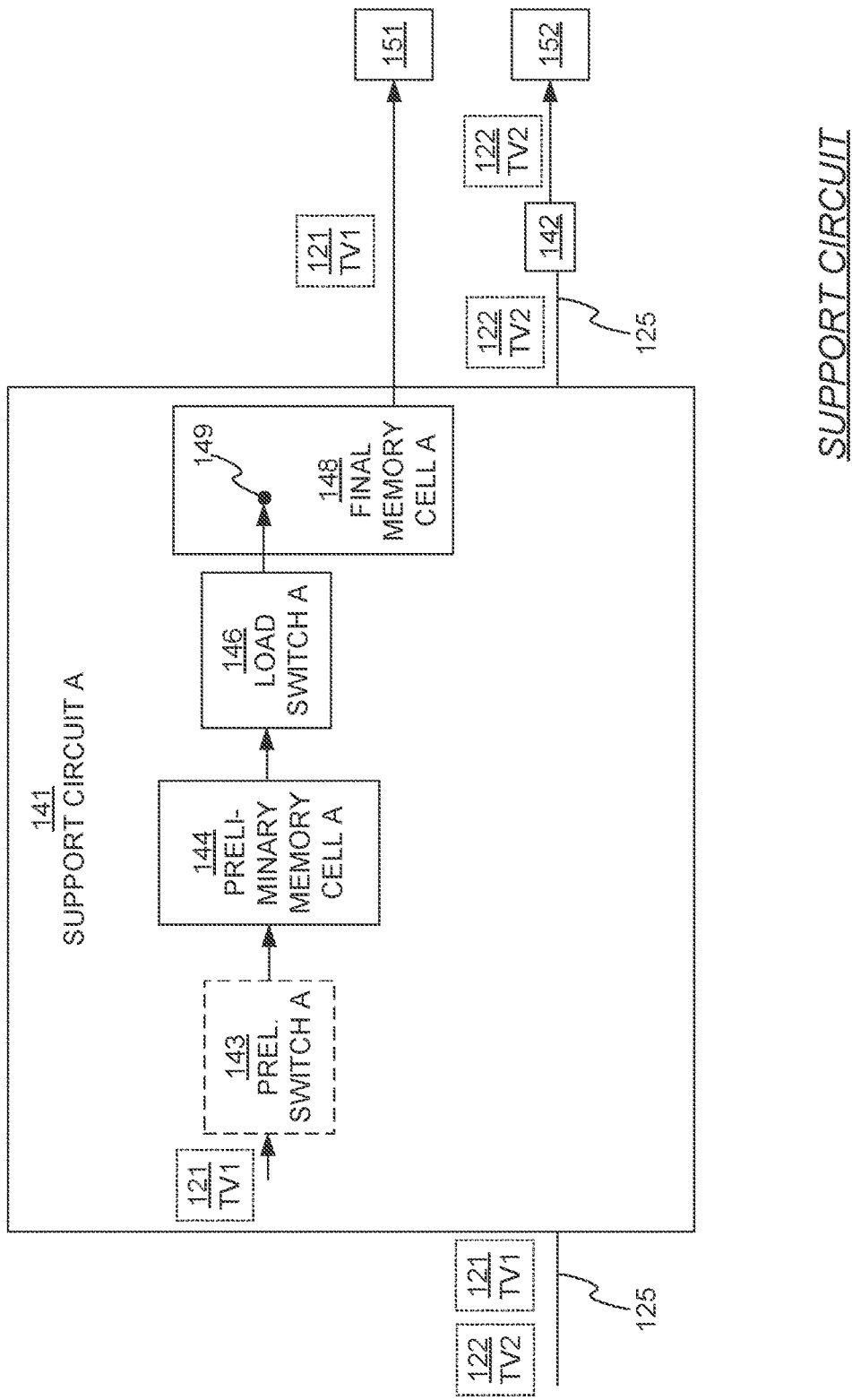
FIG. 1C is a diagram that repeats elements of FIG. 1B, while showing in more detail a first support circuit of the MQW device of FIG. 1B according to embodiments.

FIG. 1C is a diagram that repeats elements of FIG. 1B, while showing first support circuit A 141 in more detail. As before, data line 125 delivers transmission values TV1 121, TV2, 122 to first support circuit A 141 and second support circuit 142 respectively. Data line 125 is not shown within first support circuit A 141, but is interrupted by it. As will be seen, before reaching second support circuit 142, in some embodiments data line 125 includes components of first support circuit A 141, while in other embodiments data line 125 bypasses all components of first support circuit A 141.

First support circuit A 141 includes a first preliminary memory cell A 144 that is configured to store the received first transmittance value TV1 121. First support circuit A 141 also includes a first load switch A 146, and a first final memory cell A 148. First final memory cell A 148 has a first data node 149. First final memory cell A 148 can be configured to receive first transmittance value TV1 121 from first preliminary memory cell A 144 through first load switch A 146, and store the received first transmittance value TV1 121. Accordingly, a transmittance of first transmission element 151 may depend on first transmittance value TV1 121 that is stored in first final memory cell A 148.

In the example of FIG. 1C, the dual memory cells are first preliminary memory cell A 144 and first final memory cell A 148. In embodiments, then, first preliminary memory cell A 144 is further configured to receive via data line 125 a subsequent transmittance value. First preliminary memory cell A 144 can be further configured to store the received subsequent transmittance value, concurrently with first final memory cell A 148 storing first transmittance value TV1 121. First final memory cell A 148 can be configured to then store the subsequent transmittance value.

In some embodiments, first support circuit A 141 further includes a first preliminary switch A 143. In such embodiments, first transmittance value TV1 121 can be received via data line 125 by first preliminary memory cell A 144 through first preliminary switch A 143. First preliminary switch A 143 can be used in serial embodiments to isolate first preliminary memory cell A 144 from data line 125 when transmittance values are transported for other pixels. In such embodiments, first transmittance value TV1 121 can be configured to be received through first preliminary switch A 143 responsive to a column signal.

There is a number of ways in which the components of first support circuit A 141 may be implemented. Briefly, the switches can be made using (Field Effect Transistors) ("FET"s), and the memory cells can be made using SRAM or DRAM cells. Examples are now described.

FIG. 2 is a diagram of a FET 243. First preliminary switch A 143 may include FET 243, which opens responsive to column signal COL.

FIG. 3 is a schematic diagram of a preliminary memory cell 344. Preliminary memory cell 344 can be first preliminary memory cell A 144, which includes two inverters 301, 302. For output stability, inverter 301 can be strong while inverter 302 can be weak. This can be accomplished in a number of ways. For example, inverters 301, 302 can be operated at different supply voltages. Inverter 301 could have a lower inversion voltage. In embodiments, inverter 302 is a tri-state inverter, capable of assuming a high output-impedance state depending on a signal S2. Of course, when an inverter is used, it is possible that first preliminary memory cell A 144 is configured to store a negative version of first transmittance value TV1 121.

FIG. 4 is a diagram of a capacitor 444. First preliminary memory cell A 144 may include a capacitor such as capacitor 444—this would be a DRAM implementation.

FIG. 5 is a diagram of a FET 546. First load switch A 146 may include FET 546.

In some embodiments, the first transmittance value is configured to be received through the first load switch responsive to a load signal LOAD. FIG. 5 shows how such a load signal may be received.

FIG. 6 is a schematic diagram of a final memory cell 648, which includes a first data node 649. Final memory cell 648 can be used for first final memory cell A 148. First final memory cell A 648 includes two inverters 603, 604. For output stability, inverter 603 can be strong while inverter 604 can be weak. In embodiments, inverter 604 is a tri-state inverter, capable of assuming a high output-impedance state depending on a signal S3. Again, when an inverter is used, it is possible that first final memory cell A 148 is configured to store a negative version of first transmittance value TV1 121, so appropriate planning may be conducted. Inverters 603, 604 can be coupled between first data node 649 and a first inverting node 647. A transmittance of first transmission element 151 may depend on first transmittance value TV1 121 stored in first inverting node 647.

Examples are now described of particular embodiments of first support circuit A 141. It will be recognized that these examples include ingredients described in FIGS. 2-6.

FIG. 7A is a schematic diagram of a support circuit 741 that could be first support circuit A 141. Support circuit 741 receives data from data line 725, which can be data line 125. Support circuit 741 includes a FET 743 that functions as the first preliminary switch, and a pair of inverters 701, 702 that function as the first preliminary memory cell, responding to a column signal COL. Inverter 702 may receive the complementary COL signal (COL_BAR or /COL). Support circuit 741 additionally includes a FET 746 that functions as the first load switch, and a pair of inverters 703, 704 that function as the final memory cell. Inverters 703, 704 are coupled between a first data node 749 and a first inverting node 747. Inverter 704 may receive the complementary load command LOAD_BAR.

Figure 7B:
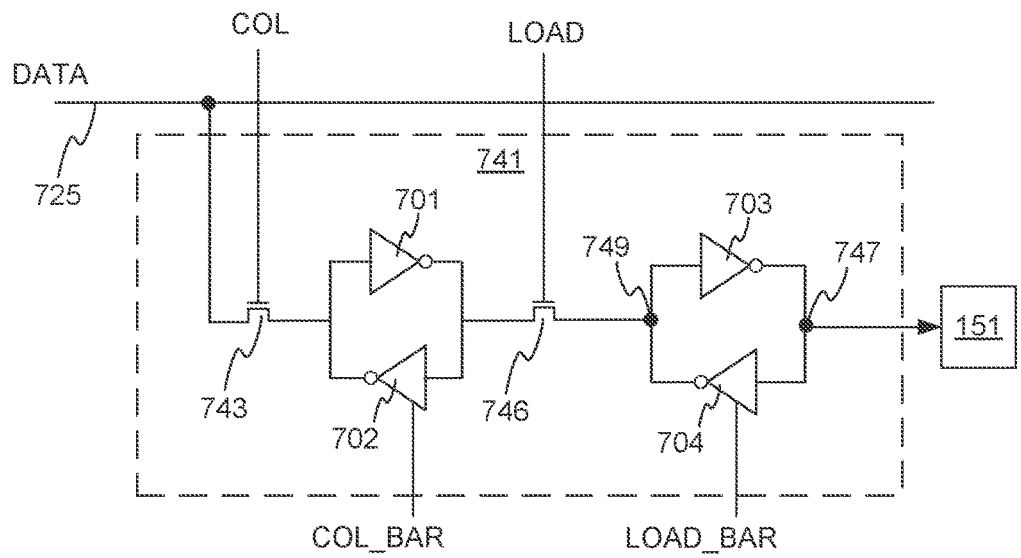
FIG. 7B is a timing diagram of signals that can be used in the circuit of FIG. 7A.
Figure 7B:
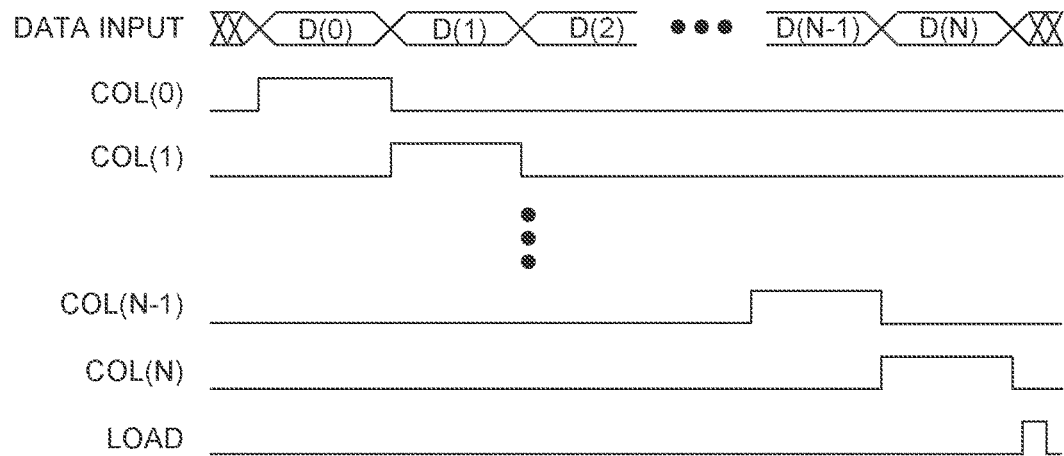

FIG. 7B is a timing diagram of signals that can be used in the circuit of FIG. 7A. The data may be input in any order, as long as the column select signal matches the data order.

FIG. 8A is a schematic diagram of a support circuit 841 that could be first support circuit A 141. Support circuit 841 receives data from data line 825, which can be data line 125. Support circuit 841 includes a FET 843 that functions as the first preliminary switch, and a capacitor 844 that functions as the first preliminary memory cell. FET 843 may respond to a column signal COL. Support circuit 841 additionally includes a FET 846 that functions as the first load switch, and a pair of inverters 803, 804 that function as the final memory cell. Inverters 803, 804 are coupled between a first data node 849 and a first inverting node 847. FET 846 may respond to a load command LOAD, while inverter 804 may receive the complementary load command LOAD_BAR.

Figure 8B:
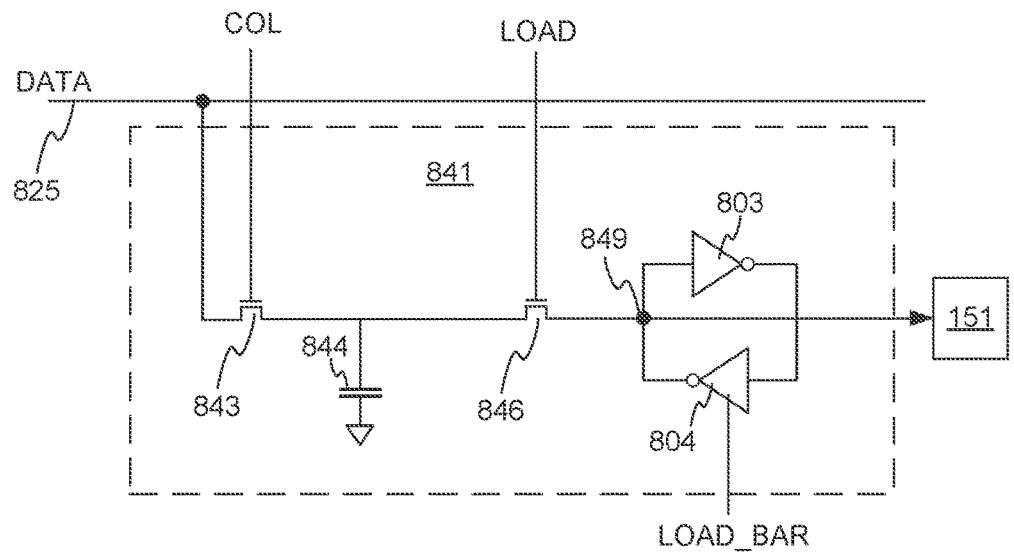
FIG. 8B is a timing diagram of signals that can be used in the circuit of FIG. 8A.
Figure 8B:
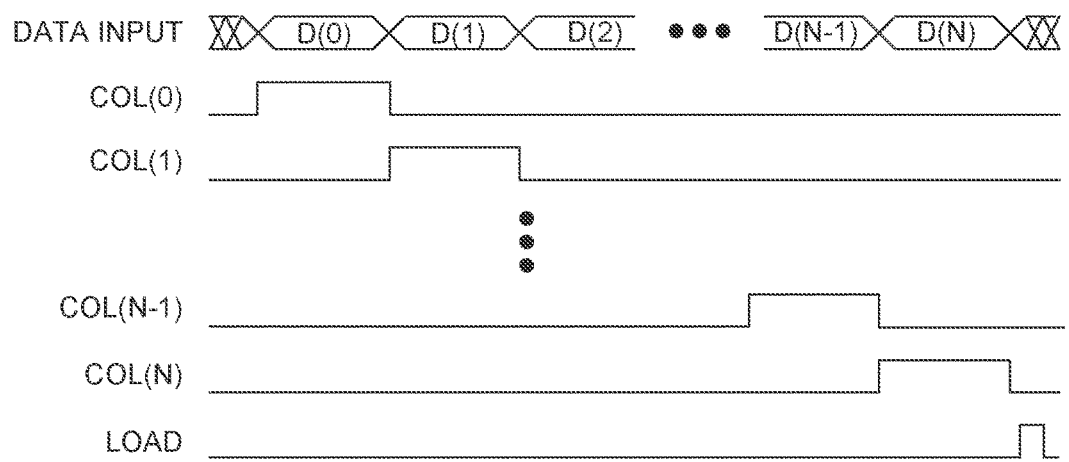

FIG. 8B is a timing diagram of signals that can be used in the circuit of FIG. 8A. The data may be input in any order, as long as the column select signal matches the data order.

Figure 9A:
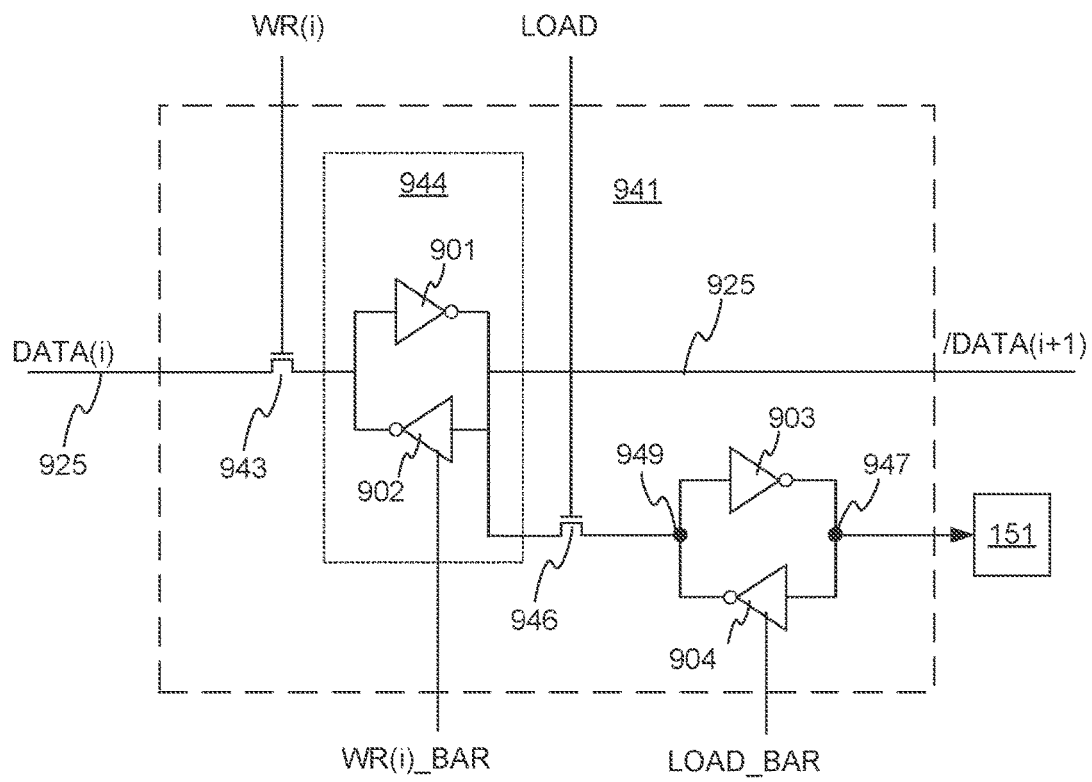
FIG. 9A is a schematic diagram of one more sample embodiment of the support circuit of FIG. 1C.

FIG. 9A is a schematic diagram of a support circuit 941 that could be first support circuit A 141. Support circuit 941 receives data DATA(i) from data line 925, which can be data line 125. Support circuit 941 includes a FET 943 that functions as the first preliminary switch, and a pair of inverters 901, 902 that function as a first preliminary memory cell 944. FET 943 may respond to a write signal WR(i), while inverter 902 may receive the complementary write signal WR(i)_BAR. Support circuit 941 additionally includes a FET 946 that functions as the first load switch, and a pair of inverters 903, 904 that function as the final memory cell. Inverters 903, 904 are coupled between a first data node 949 and a first inverting node 947. FET 946 may respond to a load command LOAD, while inverter 904 may receive the complementary load command LOAD_BAR.

FIG. 9A is an example of an embodiment where data line 925 includes a component of a support circuit, namely first preliminary memory cell 944. While transmittance value DATA(i) may be received in its positive version, the transmittance value DATA(i+1) for the next pixel may be received inverted, i.e. a complementary or negative version may be received. In that case, an additional inverter may be needed for the support circuit of every second pixel, or the even numbered columns, and therefore the support circuits might not be all the same.

Figure 9B:
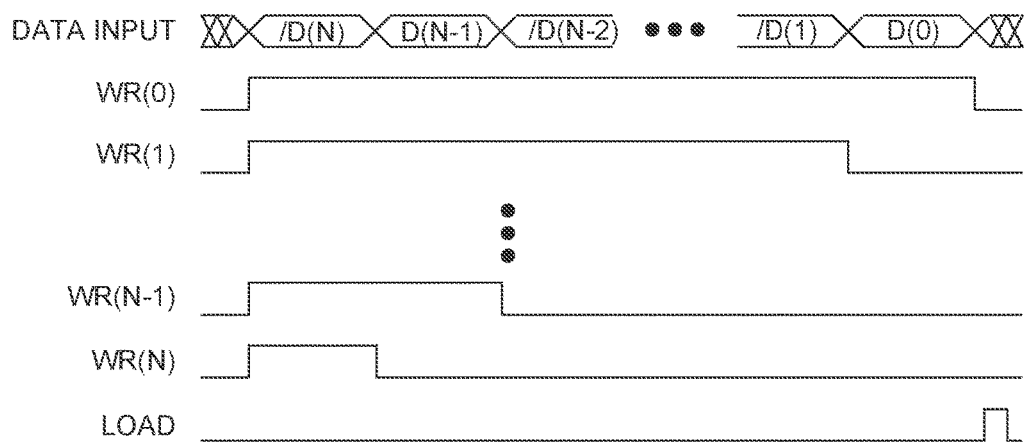
FIG. 9B is a timing diagram of signals that can be used in the circuit of FIG. 9A.

FIG. 9B is a timing diagram of signals that can be used in the circuit of FIG. 9A. Data is shifted in from column 0 to column n. In this example it is assumed that n is odd. It should be observed that alternate data is served in its complementary form.

Whether the additional inverter is provided or not, the other support circuits such as second support circuit B 142 can have largely similar components. For example, second support circuit B 142 may include a second preliminary memory cell configured to store the received second transmittance value, a second load switch, and a second final memory cell. The second final memory cell can be configured to receive the second transmittance value from the second preliminary memory cell through the second load switch. In such cases, the second support circuit can be configured to store the second transmittance value in the second final memory cell.

In many embodiments, a single load signal is used for many or all the pixels. For example, the first final memory cell can be configured to receive the first transmittance value responsive to a load signal, and the second final memory cell can be configured to receive the second transmittance value responsive to the same load signal. Accordingly, the final memory cells can be refreshed with new values simultaneously at the rising edge of the LOAD command.

The embodiments mentioned above may be provided on an Integrated Circuit (IC) chip. Such an IC chip may include a substrate, and a MQW device may be provided on the substrate. Source 160 would transmit beam 170 towards the IC chip, and the transmitted beam is aimed towards the MQW device. Such an IC chip may further include additional components for an MQW array system. An example is now described.

Figure 10:
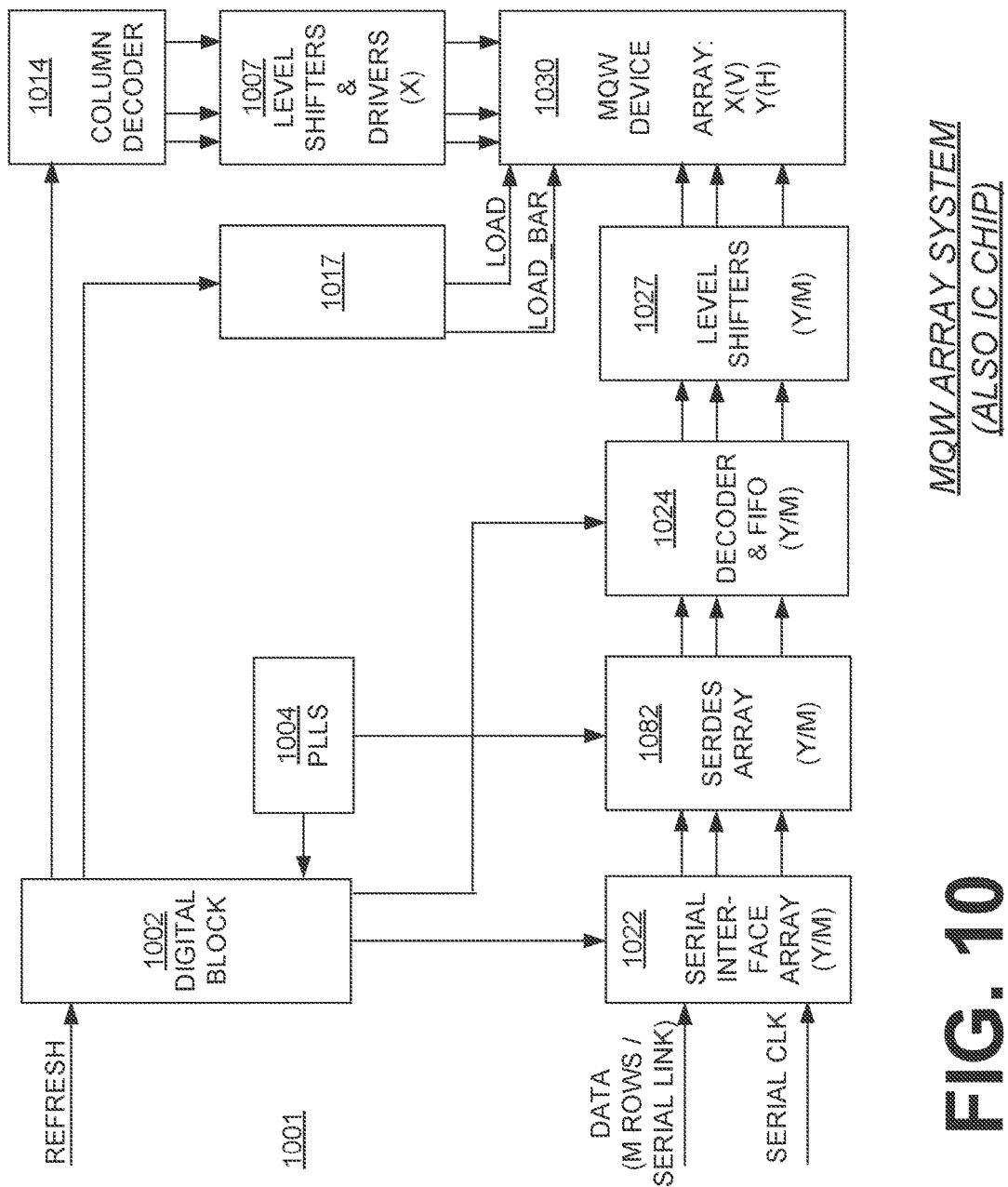
FIG. 10 is a block diagram of a sample MQW array system that includes an MQW device according to embodiments.

FIG. 10 is a block diagram of an MQW array system 1001 according to embodiments, which includes a MQW device 1030 that can be made as described above. System 1001 includes a digital block 1002 that inputs a refresh signal, and one or more Phase Locked Loops 1004 for synchronization. Generally, data is received along the horizontal direction, and addressing the pixels is performed along the vertical direction.

Along the horizontal direction, system 1001 includes a serial interface array 1022, a SERDES array 1082, a decoder and FIFO 1024, and level shifters 1027 feeding data in MQW device 1030. Serial interface array 1022 may include multiple high speed serial data and clock ports for speed, i.e. high frame rate. Serial interface array 1022 may receive data over M rows across a serial link plus a serial clock. SERDES array 1082 may include multiple SERDES units to deserialize data and retime them. Decoder and FIFO 1024 may perform 10b/8b decoding so as to lower the bit error rate (BER), while the FIFO (First In First Out) may adjust data speed.

Along the vertical direction, a column decoder 1014 may enable columns of MQW device 130 for writing, for example by originating the COL signal. Level shifters and drivers 1007 may convert low voltage signal to high voltage (e.g. 10V). In addition, a unit 1017 may provide the load signal (LOAD) and its complement (/LOAD).

The embodiments mentioned above may achieve high speed and low bit error rate (BER) with low power.

Figure 11:
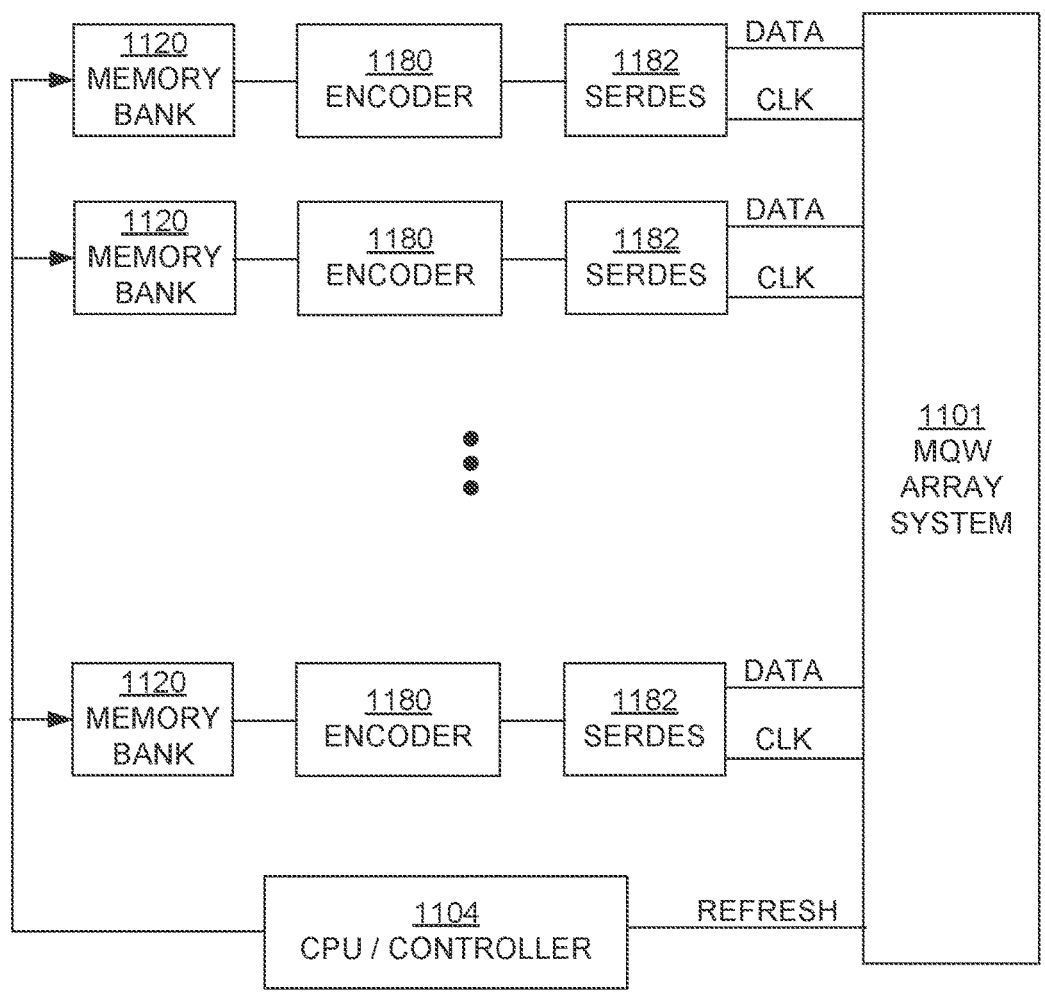
FIG. 11 is a block diagram of a sample architecture according to embodiments.

FIG. 11 is a block diagram of an architecture 1100. A CPU/Controller 1104 may first calculate the desired mask pattern for one full scan of a target, and then load into external memory banks 1120 the transmittance values. For example, there can be a total 25M frames per scan, and the required capacity for external memory banks 1120 may thus be 5.184 TB.

After the transmittance values are loaded, external memory banks 1120 can be read, and their data can be sent to MQW array system 1101, which can be as described in FIG. 10. In the process, the data can be passed by encoder 1180 that may do 8b/10b encoding, and then through a Serializer-Deserializer (SERDES) 1182 to convert serial data to parallel.

Figure 12:
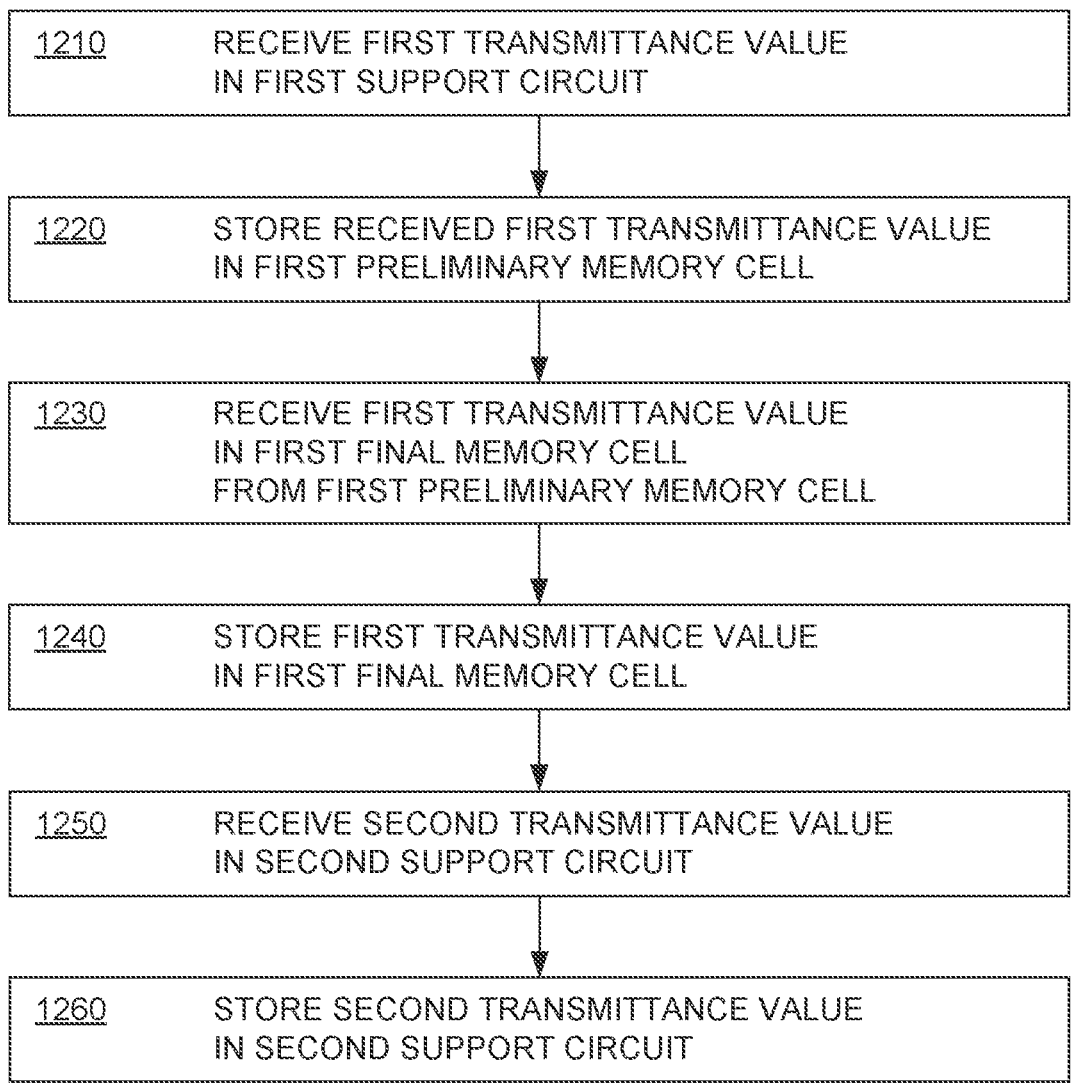
FIG. 12 is a flowchart for illustrating methods according to embodiments.

FIG. 12 shows a flowchart 1200 for describing methods according to embodiments. The methods of flowchart 1200 may also be practiced by embodiments described above, such as where an MQW device is used.

According to an operation 1210, a first transmittance value is received in a first support circuit via a data line. In embodiments where the first support circuit also has a first preliminary switch, the first transmittance value can be so received through the first preliminary switch. Receiving may be performed through the first preliminary switch responsive to a column signal.

According to another operation 1220, the received first transmittance value is stored in the first preliminary memory cell.

According to another operation 1230, the first transmittance value is received in the first final memory cell from the first preliminary memory cell, through the first load switch.

According to another operation 1240, the first transmittance value received at operation 1230 may be stored in a first final memory cell. In such embodiments, a transmittance of a first transmission element may depend on the first transmittance value stored in the first final memory cell.

According to another operation 1250, a second transmittance value can be received in a second support circuit, for example via a data line.

According to another operation 1260, the second transmittance value received at operation 1250 is stored in the second support circuit. In such embodiments, a transmittance of a second transmission element may depend on the second transmittance value stored in the second support circuit.

In such embodiments, the first and the second transmission elements may permit to emerge, according to their transmittances, beamlets of a transmitted beam that reaches an MQW device, and the beamlets emerging from the MQW device may reach and pattern a target.

The process may be repeated. For example, a subsequent transmittance value may be received in the first preliminary memory cell, via the data line. The received subsequent transmittance value may be stored in the first preliminary memory cell, concurrently with the first final memory cell storing the first transmittance value. The subsequent transmittance value may then be received and stored in the first final memory cell. All the variations mentioned above with reference to the circuits and systems may also apply with reference to the methods of flowchart 1200.

In the methods described above, each operation can be performed as an affirmative step of doing, or causing to happen, what is written that can take place. Such doing or causing to happen can be by the whole system or device, or just one or more components of it. In addition, the order of operations is not constrained to what is shown, and different orders may be possible according to different embodiments. Moreover, in certain embodiments, new operations may be added, or individual operations may be modified or deleted. The added operations can be, for example, from what is mentioned while primarily describing a different system, apparatus, device or method.

A person skilled in the art will be able to practice the present invention in view of this description, which is to be taken as a whole. Details have been included to provide a thorough understanding. In other instances, well-known aspects have not been described, in order to not obscure unnecessarily the present invention. Plus, any reference to any prior art in this description is not, and should not be taken as, an acknowledgement or any form of suggestion that this prior art forms parts of the common general knowledge in any country.

This description includes one or more examples, but that does not limit how the invention may be practiced. Indeed, examples or embodiments of the invention may be practiced according to what is described, or yet differently, and also in conjunction with other present or future technologies. Other embodiments include combinations and sub-combinations of features described herein, including for example, embodiments that are equivalent to: providing or applying a feature in a different order than in a described embodiment; extracting an individual feature from one embodiment and inserting such feature into another embodiment; removing one or more features from an embodiment; or both removing a feature from an embodiment and adding a feature extracted from another embodiment, while providing the features incorporated in such combinations and sub-combinations.

In this document, the phrases "constructed to" and/or "configured to" denote one or more actual states of construction and/or configuration that is fundamentally tied to physical characteristics of the element or feature preceding these phrases and, as such, reach well beyond merely describing an intended use. Any such elements or features can be implemented in any number of ways, as will be apparent to a person skilled in the art after reviewing the present disclosure, beyond any examples shown in this document.

The following claims define certain combinations and subcombinations of elements, features and steps or operations, which are regarded as novel and non-obvious. Additional claims for other such combinations and subcombinations may be presented in this or a related document.

The invention claimed is:

1. A method to pattern a target using a multiple-quantum-well (MQW) device configured for use in a semiconductor patterning system, the method comprising:
receiving at a first preliminary memory cell of a first pixel a first transmittance value from a memory bank of the semiconductor patterning system via a data line, the first pixel including a first transmission element and a first support circuit, the first support circuit including the first preliminary memory cell, a first load switch, and a first final memory cell;
receiving the first transmittance value at the first final memory cell from the first preliminary memory cell via the first load switch;
storing the first transmittance value in the first final memory cell;
receiving at a second preliminary memory cell of a second pixel a second transmittance value from the memory bank of the semiconductor patterning system via the data line, the second pixel including a second transmission element and a second support circuit, the second support circuit including the second preliminary memory cell, a second load switch, and a second final memory cell;
receiving the second transmittance value at the second final memory cell from the second preliminary memory cell via the second load switch;
storing the second transmittance value in the second final memory cell;
passing, based on the first stored transmittance value and the second stored transmittance value, a beam of energy through the first and second transmission elements, as a first beamlet of energy emerging from the first transmission element towards the target at a first position and as a second beamlet of energy emerging from the second transmission element towards the target to pattern the target; and
blocking, based on a change of the first stored transmittance value, the beam of energy at the first transmission element,
wherein the target includes a semiconductor material.

2. The method of claim 1, wherein the first support circuit further includes a first preliminary switch,
wherein receiving the first transmittance value further comprises receiving the first transmittance value at the first preliminary memory cell through the first preliminary switch.

3. The method of claim 2, wherein receiving the first transmittance value further comprises receiving the first transmittance value in response to a column signal coupled to the MQW device.

4. The method of claim 1,
wherein the first preliminary memory cell comprises two inverters, and
wherein the first final memory cell comprises two inverters.

5. The method of claim 1,
wherein the first preliminary memory cell is configured to store a negative version of the first transmittance value,
wherein receiving the first transmittance value further comprises storing the negative version of the first transmittance value in the first preliminary memory cell,
wherein the first final memory cell is configured to store a negative version of the first transmittance value, and
wherein storing the first transmittance value in the first final memory cell further comprises storing the negative version of the first transmittance value in the first final memory cell.

6. The method of claim 1, wherein receiving the first transmittance value at the first final memory cell comprises receiving the first transmittance value at the first final memory cell in response to a load signal.

7. The method of claim 1, wherein the first final memory cell comprises two inverters.

8. The method of claim 1, wherein receiving the first transmittance value at the first final memory cell comprises receiving the first transmittance value at the first final memory cell in response to a load signal, and
wherein receiving the second transmittance value at the second final memory cell comprises receiving the second transmittance value at the second final memory cell in response to the load signal.

9. The method of claim 1,
wherein after the first beamlet is illuminated on the target, the target is moved to a predetermined position.

10. A method for a MQW device that is configured for use in a semiconductor patterning system that is intended to pattern a target, the MQW device including a first pixel that has a first transmission element and a first support circuit and a second pixel that has a second transmission element and a second support circuit the first support circuit having a first preliminary memory cell, a first load switch, and a first final memory cell, the semiconductor patterning system including a memory bank configured to store a first and a second transmittance values, a data line coupled to the memory bank, and a source configured to transmit a beam of energy towards the MQW device, the method comprising:
receiving, in the first support circuit, the first transmittance value via the data line;
storing the received first transmittance value in the first preliminary memory cell;
receiving, in the first final memory cell, the first transmittance value from the first preliminary memory cell through the first load switch;
storing, in the first final memory cell, the first transmittance value received through the first load switch, a transmittance of the first transmission element depending on the first transmittance value stored in the first final memory cell;
receiving, in the second support circuit, the second transmittance value via the data line; and
storing, in the second support circuit, the received second transmittance value, a transmittance of the second transmission element depending on the second transmittance value stored in the second support circuit,
in which the first and the second transmission elements selectively permit to emerge, according to their transmittances, beamlets of the transmitted beam that reaches the MQW device, and
the beamlets emerging from the MQW device reach and pattern the target,
wherein the target includes a semiconductor material.

11. The method of claim 10, further comprising:
then receiving, in the first preliminary memory cell, via the data line a subsequent transmittance value; and
storing, in the first preliminary memory cell, the received subsequent transmittance value concurrently with the first final memory cell storing the first transmittance value.

12. The method of claim 11, further comprising:
then receiving and storing the subsequent transmittance value in the first final memory cell.

13. The method of claim 10, in which
the first support circuit also has a first preliminary switch, and
the first transmittance value is received via the data line by the first preliminary memory cell through the first preliminary switch.

14. The method of claim 13, in which
the first transmittance value is received through the first preliminary switch responsive to a column signal.

15. The method of claim 10, in which
the first preliminary memory cell stores a negative version of the first transmittance value.

16. The method of claim 10, in which
the first transmittance value is configured to be received through the first load switch responsive to a load signal.

17. The method of claim 10, in which
the first final memory cell stores a negative version of the first transmittance value.

18. The method of claim 10, in which
the second support circuit has a second preliminary memory cell that stores the received second transmittance value, a second load switch, and a second final memory cell,
the second transmittance value is received in by the second final memory cell from the second preliminary memory cell through the second load switch,
the received second transmittance value is stored in the second final memory cell.

19. The method of claim 18, in which
the first final memory cell receives the first transmittance value responsive to a load signal, and
the second final memory cell receives the second transmittance value responsive to the load signal.

20. The method of claim 10,
wherein after the beamlets are illuminated on the target, the target is moved to a predetermined position.

* * * * *